US010644707B2

(12) United States Patent
Jung

(10) Patent No.: US 10,644,707 B2
(45) Date of Patent: May 5, 2020

(54) DELAY CIRCUIT

(71) Applicant: SK hynix Inc., Gyeonggi-do (KR)

(72) Inventor: In-Hwa Jung, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/196,279

(22) Filed: Nov. 20, 2018

(65) Prior Publication Data
US 2019/0280697 A1 Sep. 12, 2019

(30) Foreign Application Priority Data

Mar. 7, 2018 (KR) .................. 10-2018-0026780

(51) Int. Cl.
*H03L 7/087* (2006.01)
*H03L 7/081* (2006.01)

(52) U.S. Cl.
CPC ............ *H03L 7/0818* (2013.01); *H03L 7/087* (2013.01); *H03L 7/0814* (2013.01)

(58) Field of Classification Search
USPC ................... 327/147–149, 156–158
See application file for complete search history.

(56) References Cited

U.S. PATENT DOCUMENTS

| | | | | |
|---|---|---|---|---|
| 6,959,062 B1 * | 10/2005 | Stubbs | ............... | H03K 5/131 375/376 |
| 7,973,606 B2 * | 7/2011 | Kim | ............... | H03L 7/1976 331/1 A |
| 8,358,160 B2 * | 1/2013 | Kim | ............... | H03L 7/0816 327/148 |
| 8,373,478 B2 * | 2/2013 | Ku | ............... | H03L 7/0818 327/149 |
| 9,225,507 B1 * | 12/2015 | Lye | ............... | H04L 7/0331 |
| 9,356,611 B1 | 5/2016 | Shyu et al. | | |
| 2007/0026814 A1 * | 2/2007 | Gierkink | ............... | H03L 7/087 455/73 |
| 2007/0182470 A1 * | 8/2007 | Heyne | ............... | G06F 1/10 327/158 |
| 2007/0229129 A1 * | 10/2007 | Nakagawa | ............... | H03L 7/087 327/156 |
| 2008/0079470 A1 * | 4/2008 | Yun | ............... | H03L 7/0814 327/158 |
| 2010/0052748 A1 * | 3/2010 | Kim | ............... | H03L 7/0812 327/158 |
| 2012/0146692 A1 * | 6/2012 | Yun | ............... | H03L 7/087 327/157 |
| 2014/0084976 A1 * | 3/2014 | Maneatis | ............... | H03L 7/07 327/157 |

(Continued)

FOREIGN PATENT DOCUMENTS

KR 101103067 1/2012

*Primary Examiner* — Adam D Houston
(74) *Attorney, Agent, or Firm* — IP & T Group LLP

(57) ABSTRACT

A delay circuit includes: a variable delay line suitable for receiving an input signal and generating an output signal by delaying the input signal; a first phase difference detector suitable for detecting a phase difference between the input signal and a first clock; a second phase difference detector suitable for detecting a phase difference between the output signal and a second clock; and a control circuit suitable for adjusting a delay value of the variable delay line in response to a detection result of the first phase difference detector and a detection result of the second phase difference detector.

10 Claims, 4 Drawing Sheets

(56) References Cited

U.S. PATENT DOCUMENTS

| | | | |
|---|---|---|---|
| 2014/0176204 A1* | 6/2014 | Fan | H03L 7/235 |
| | | | 327/156 |
| 2014/0333346 A1* | 11/2014 | Bae | H03L 7/087 |
| | | | 327/5 |
| 2015/0004919 A1* | 1/2015 | Ek | H03L 7/089 |
| | | | 455/75 |
| 2015/0171874 A1* | 6/2015 | Ryu | H03L 7/185 |
| | | | 327/156 |
| 2015/0263740 A1* | 9/2015 | Jung | H03L 7/0812 |
| | | | 327/158 |
| 2015/0288367 A1* | 10/2015 | Kim | H02M 3/07 |
| | | | 327/117 |
| 2016/0020773 A1* | 1/2016 | Yu | H02M 3/07 |
| | | | 331/35 |
| 2016/0105188 A1* | 4/2016 | Cho | H03L 7/087 |
| | | | 375/374 |
| 2017/0250692 A1* | 8/2017 | Motozawa | H03L 7/087 |
| 2018/0123601 A1* | 5/2018 | Jeon | G11C 7/1066 |
| 2019/0131978 A1* | 5/2019 | Sjoland | H03L 7/0891 |
| 2019/0131979 A1* | 5/2019 | Nilsson | G06F 1/04 |
| 2019/0280696 A1* | 9/2019 | Wang | H03L 7/091 |
| 2019/0280697 A1* | 9/2019 | Jung | H03L 7/0814 |

\* cited by examiner

DELAY CIRCUIT

CROSS-REFERENCE TO RELATED APPLICATION

This application claims priority under 35 U.S.C. § 119 to Korean Patent Application No. 10-2018-0026780, filed on Mar. 7, 2018, which is incorporated herein by reference in its entirety.

BACKGROUND

1. Field

The present invention relates to a delay circuit.

2. Discussion of the Related Art

Generally, integrated circuits or chips use various types of delay circuits for delaying a signal.

Certain types of delay circuits may delay an input signal by a desired phase. For example, in a memory system, a delay circuit of a memory controller may receive a data strobe signal from a memory device, delay the data strobe signal by 90 degrees based on a clock signal, and use the delayed signal. In this case, the memory controller requires a delay circuit for delaying the data strobe signal by 90 degrees. When a general delay circuit is used to delay an input signal, the delay amount may be changed depending on process, voltage and temperature (PVT) variation in the integrated circuit or chip embodying the delay circuit, which makes it difficult to delay the input signal by the desired phase. Therefore, there is a demand for a delay circuit capable of delaying an input signal by a target phase even though PVT variation occurs.

SUMMARY

Various embodiments are directed to a technique for adjusting a delay value of a delay circuit to a target value.

In an embodiment, a delay circuit may include: a variable delay line suitable for receiving an input signal and generating an output signal by delaying the input signal; a first phase difference detector suitable for detecting a phase difference between the input signal and a first clock; a second phase difference detector suitable for detecting a phase difference between the output signal and a second clock; and a control circuit suitable for adjusting a delay value of the variable delay line in response to a detection result of the first phase difference detector and a detection result of the second phase difference detector.

The first and second clocks may have a phase difference corresponding to a target delay value of the variable delay line.

In an embodiment, a memory system may include: a memory device; and a memory controller including a delay circuit, wherein the delay circuit includes: a variable delay line suitable for receiving a data strobe signal as an input signal from the memory device and generating an output signal by delaying the input signal; a first phase difference detector suitable for detecting a phase difference between the input signal and a first clock; a second phase difference detector suitable for detecting a phase difference between the output signal and a second clock; and a control circuit suitable for adjusting a delay value of the variable delay line in response to a detection result of the first phase difference detector and a detection result of the second phase difference detector.

DETAILED DESCRIPTION

Figure 1:
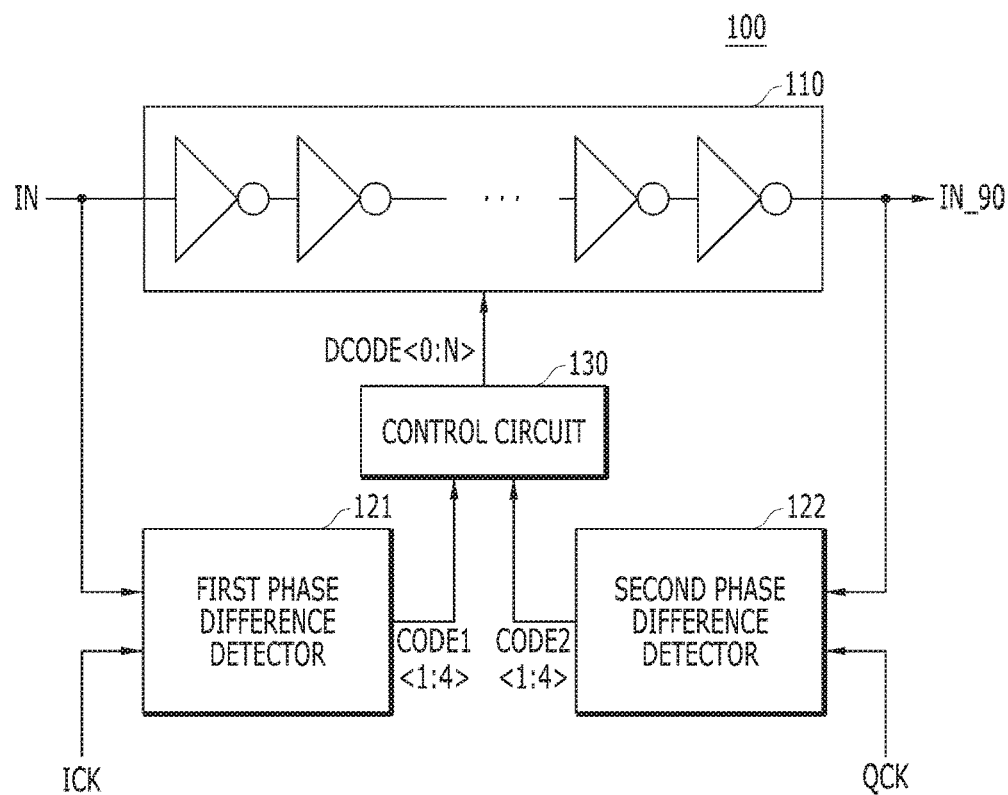
FIG. 1 is a diagram illustrating a delay circuit in accordance with an embodiment.

Various embodiments will be described below in more detail with reference to the accompanying drawings. The present invention may, however, be embodied in different forms, and thus is not limited to the embodiments set forth herein. Rather, these embodiments are provided so that this disclosure is thorough and complete and fully conveys the scope of the present invention to those skilled in the art. Throughout the disclosure, like reference numerals refer to like parts throughout the various figures and embodiments of the present invention. Also, throughout the specification, reference to "an embodiment," "another embodiment," or the like is not necessarily to only one embodiment, and different references to any such phrase are not necessarily to the same embodiment(s).

FIG. 1 is a diagram illustrating an example of a delay circuit 100 in accordance with an embodiment.

Referring to FIG. 1, the delay circuit 100 may include a variable delay line 110, a first phase difference detector 121, a second phase difference detector 122 and a control circuit 130.

The variable delay line 110 may receive an input signal IN and generate an output signal IN_90 by delaying the input signal IN. The variable delay line 110 may have a delay value which may be adjusted according to a delay code DCODE<0:N>. A target delay value of the variable delay line 110 may correspond to a phase of 90 degrees based on a first clock ICK. The input signal IN may include a periodic wave and have the same cycle as the first clock ICK.

The first phase difference detector 121 may detect a phase difference between the input signal IN and the first clock ICK, and output the detection result as a first code CODE1<1:4>. Specifically, the first phase difference detector 121 may detect a phase difference between an edge (e.g., a rising edge) of the input signal IN and a corresponding edge (e.g., a rising edge) of the first clock ICK.

The second phase difference detector 122 may detect a phase difference between the output signal IN_90 and a second clock QCK, and output the detection result as a second code CODE2<1:4>. Specifically, the second phase difference detector 122 may detect a phase difference between an edge (e.g., a rising edge) of the output signal IN_90 and a corresponding edge (e.g., a rising edge) of the second clock QCK. Here, a phase difference between the second clock QCK and the first clock ICK may be equal to the target delay value of the variable delay line 110. Each of the first and second phase detectors 121 and 122 may include a time-to-digital converter. In various embodiments, the first and second codes CODE1<1:4> and CODE2<1:4> may contain a larger number of 0's with the increase of the measured phase difference therebetween, or contain a larger number of 1's with the decrease of the measured phase difference therebetween.

The control circuit 130 may adjust the delay value of the variable delay line 110 in response to the first and second codes CODE1<1:4> and CODE2<1:4>.

Figure 2:
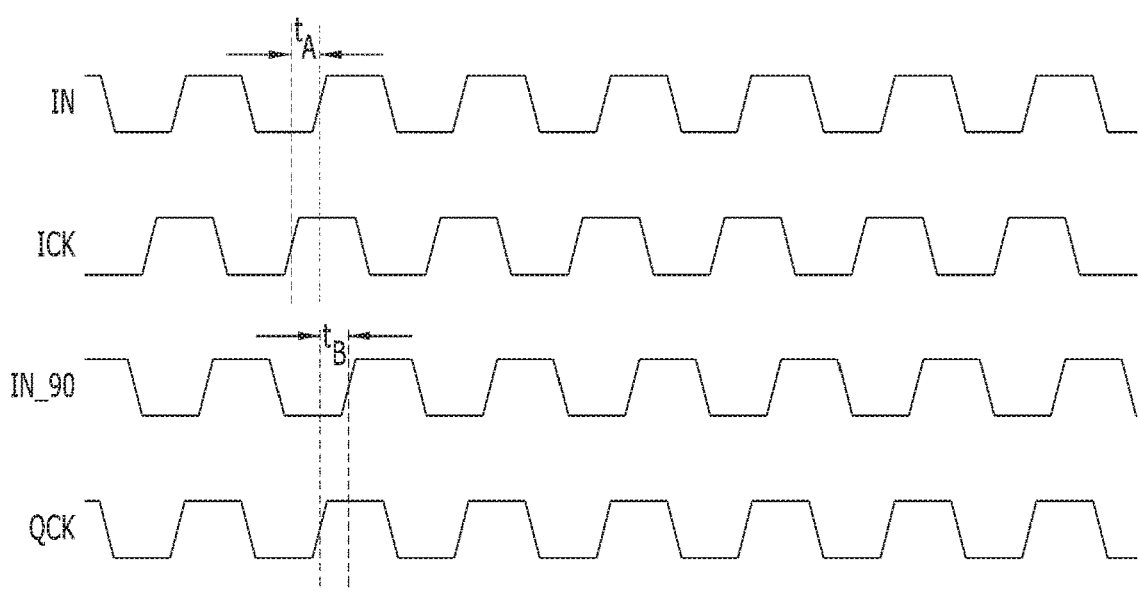
FIG. 2 is a timing diagram illustrating an example of an operation of a delay circuit in accordance with an embodiment.

FIG. 2 is a timing diagram illustrating an example of an operation of a delay circuit 100 in accordance with an embodiment. As shown in FIG. 1, the delay circuit 100 uses the input signal IN, the first clock ICK, the output signal IN_90 and the second clock QCK. In FIG. 2, $t_A$ represents a phase difference between the input signal IN and the first clock ICK, and the first code CODE1<1:4> indicates this value $t_A$. In FIG. 2, $t_B$ represents a phase difference between the output signal IN_90 and the second clock QCK, and the second code CODE2<1:4> indicates this value $t_B$. When $t_A > t_B$ where the number of values of logic low level (e.g., 0's) in the first code CODE1<1:4> is greater than the number of 0's in the second code CODE2<1:4>, it may indicate that the delay value of the variable delay line 110 is less than the target delay value. Therefore, the control circuit 130 may increase the delay value of the variable delay line 110 by increasing the value of the delay code DCODE<0: N>. When $t_A < t_B$ where the number of values of logic high level (e.g., Vs) in the first code CODE1<1:4> is greater than the number of 1's in the second code CODE2<1:4>, it may indicate that the delay value of the variable delay line 110 is greater than the target delay value. Therefore, the control circuit 130 may decrease the delay value of the variable delay line 110 by decreasing the value of the delay code DCODE<0:N>. When $t_A = t_B$ or CODE1<1:4>=CODE2<1: 4>, it may indicate that the delay value of the variable delay line 110 is equal to the target delay value. Therefore, the control circuit 180 may retain the value of the delay code DCODE<0:N>.

The delay circuit 100 of FIG. 1 may adjust the delay value of the variable delay line 110 such that a phase difference between the input signal IN and the first clock ICK is equal to a phase difference between the output signal IN_90 and the second clock QCK. Therefore, the variable delay line 110 may have the same delay value as the target delay value.

Figure 3:
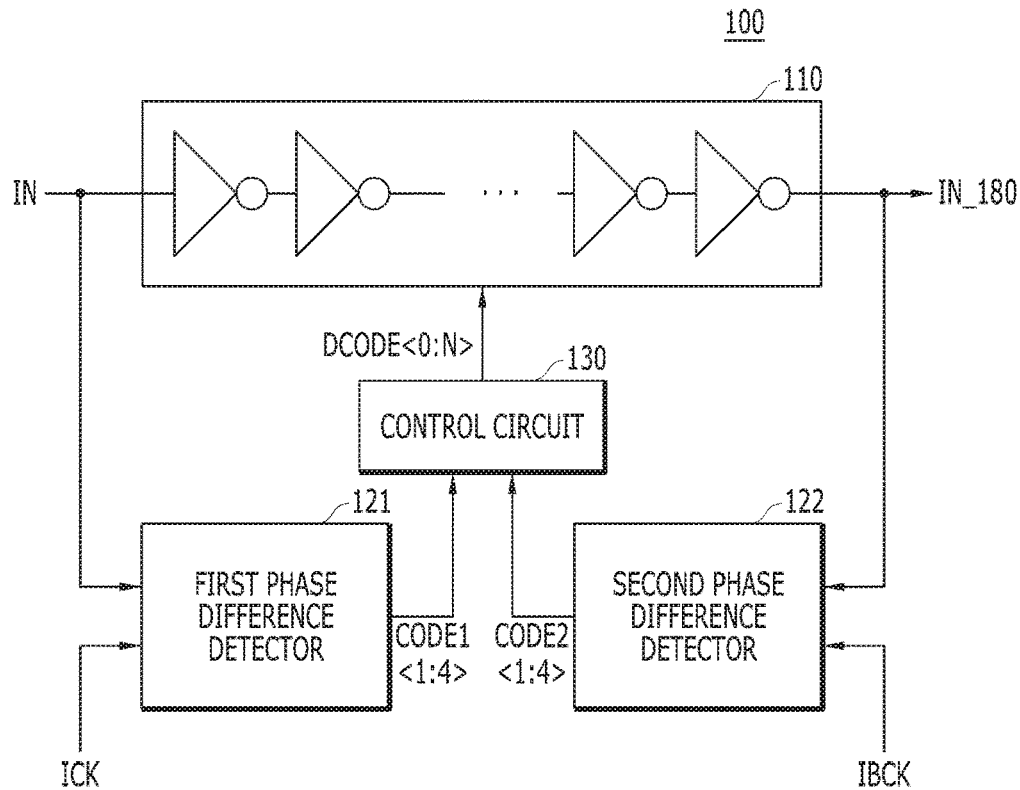
FIG. 3 is a diagram illustrating another example of a delay circuit in accordance with an embodiment.

FIG. 3 is a diagram illustrating another example of a delay circuit 100 in accordance with an embodiment. FIG. 3 illustrates the case in which the target delay value of the delay circuit 100 of FIG. 1 is a phase of 180 degrees based on the first clock ICK. In FIG. 3, an output signal is represented by IN_180 because the input signal IN is delayed by a phase of 180 degrees. Furthermore, the second clock inputted to the second phase difference detector 122 is represented by IBCK. The second clock IBCK may have a phase difference of 180 degrees from the first clock ICK. In other words, the second clock IBCK may be obtained by inverting the first clock ICK.

Figure 4:
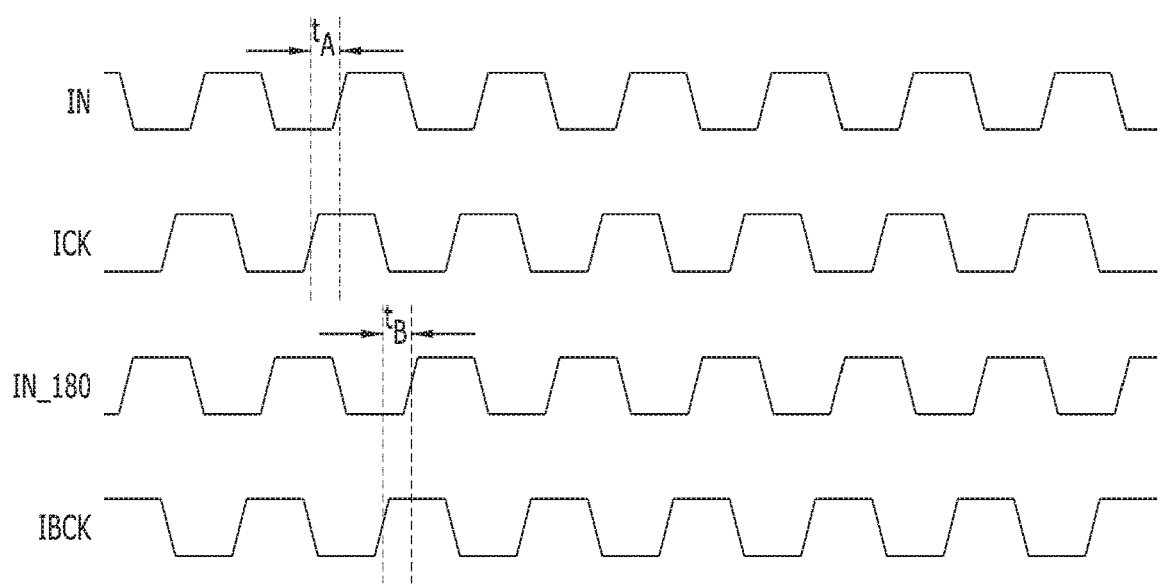
FIG. 4 is a timing diagram illustrating another example of an operation of a delay circuit in accordance with an embodiment.

FIG. 4 is a timing diagram illustrating another example of an operation of a delay circuit 100 in accordance with an embodiment. As shown in FIG. 3, the delay circuit 100 uses the input signal IN, the first clock ICK, the output signal IN_180 and the second clock IBCK. In FIG. 4, $t_A$ represents a phase difference between the input signal IN and the first clock ICK, and the first code CODE1<1:4> indicates this value $t_A$. In FIG. 4, $t_B$ represents a phase difference between the output signal IN_180 and the second clock IBCK, and the second code CODE2<1:4> indicates this value $t_B$. When $t_A > t_B$ where the number of 0's (e.g., low logic values) in the first code CODE1<1:4> is greater than the number of 0's in the second code CODE2<1:4>, it may indicate that the delay value of the variable delay line 110 is less than the target delay value. Therefore, the control circuit 130 may increase the delay value of the variable delay line 110 by increasing the value of the delay code DCODE<0:N>. When $t_A < t_B$ where the number of 1's (e.g., high logic values) in the first code CODE1<1:4> is greater than the number of 1's in the second code CODE2<1:4>, it may indicate that the delay value of the variable delay line 110 is greater than the target delay value. Therefore, the control circuit 130 may decrease the delay value of the variable delay line 110 by decreasing the value of the delay code DCODE<0:N>. When $t_A = t_B$ or CODE1<1:4>=CODE2<1:4>, it may indicate that the delay value of the variable delay line 110 is equal to the target delay value. Therefore, the control circuit 130 may retain the value of the delay code DCODE<0:N>.

Figure 5:
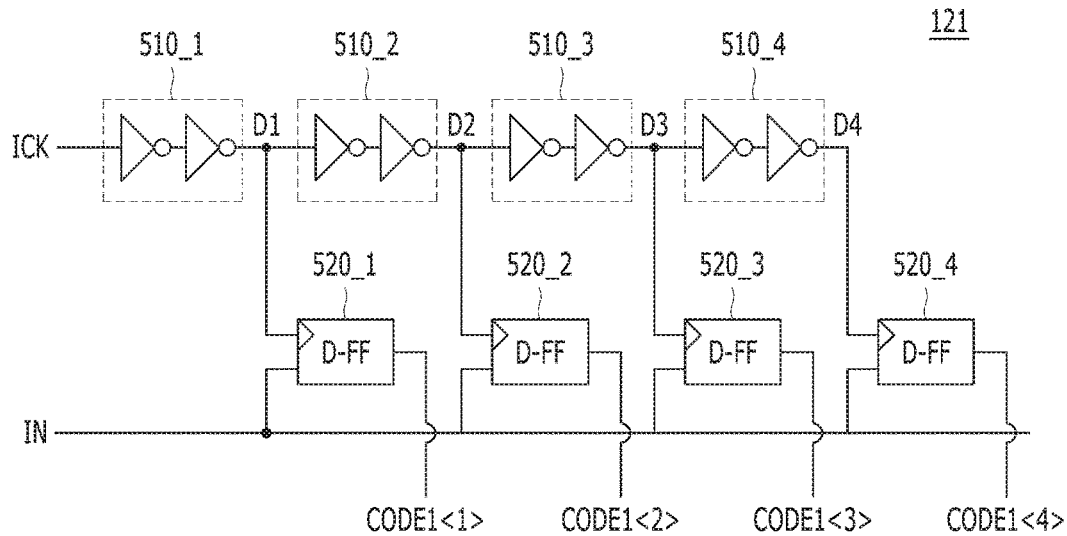
FIG. 5 is a diagram illustrating a first phase difference detector in accordance with an embodiment.

FIG. 5 is a diagram illustrating a first phase difference detector in accordance with an embodiment, for example, the first phase difference detector 121 of FIG. 1. The second phase difference detector 122 may be configured in the same manner as described with respect to FIG. 5.

Referring to FIG. 5, the first phase difference detector 121 may include a plurality of delay lines 510_1 to 510_4 and a plurality of D flip-flops 520_1 to 520_4.

The plurality of delay lines 510_1 to 510_4 may be coupled in series, and generate delayed clocks D1 to D4 by sequentially delaying the first clock ICK.

The plurality of D flip-flops 520_1 to 520_4 may receive the delayed clocks D1 to D4 through clock terminals thereof, receive the input signal IN through input terminals (i.e., D-terminals) thereof, and output first code CODE1<1:4> through output terminals (i.e., Q-terminals) thereof. Therefore, the D flip-flops 520_1 to 520_4 may sample the input signal IN at rising edges of the delayed clocks D1 to D4, and output the sampling results as the first code CODE1<1:4>.

Figure 6:
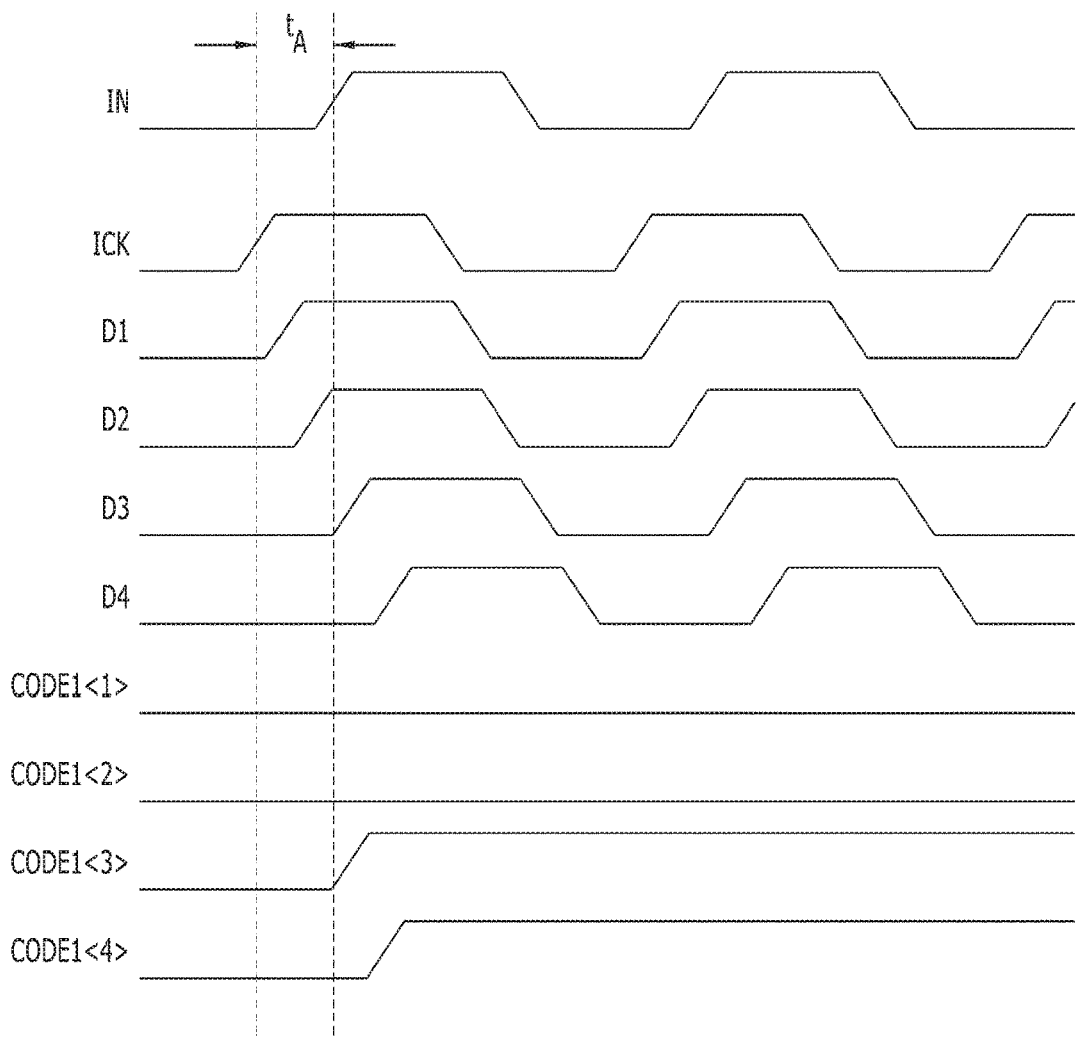
FIG. 6 is a timing diagram illustrating an operation of a first phase difference detector in accordance with an embodiment.

FIG. 6 is a timing diagram illustrating an operation of a first phase difference detector in accordance with an embodiment, for example, the operation of the first phase difference detector 121 of FIG. 5. FIG. 6 shows that the input signal IN is sampled at rising edges of the delayed clocks D1 to D4, in order to generate the first codes CODE1<1:4>. The greater the phase difference $t_A$ between the input signal IN and the first clock ICK, the more the number of 0's in the first code CODE1<1:4>. FIG. 6 shows that two bits CODE1<1:2> of the first code CODE1<1:4> have a value of logic low level "0".

In the present embodiment, it has been exemplified that the first code CODE1<1:4> contains four bits, and the numbers of the delay lines 510_1 to 510_4 and the D flip-flops 520_1 to 520_4 are set to four. However, the number of bits contained in the first code may be increased or decreased, in which case the numbers of the delay lines and the D flip-flips may also be correspondingly increased or decreased.

In accordance with embodiments, the delay value of the delay circuit may be adjusted to the target value.

Figure 7:
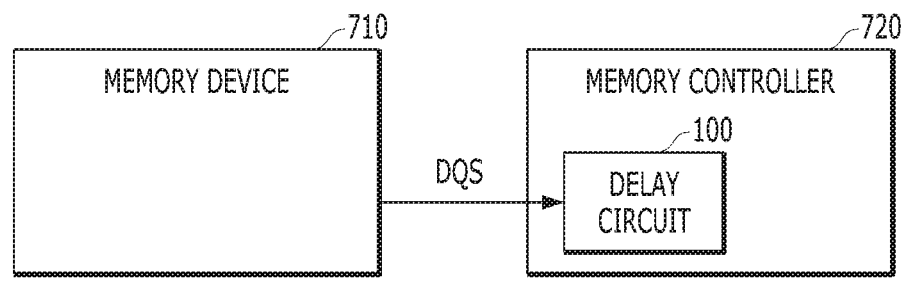
FIG. 7 is a diagram illustrating a memory system in accordance with an embodiment.

FIG. 7 is a diagram illustrating a memory system in accordance with an embodiment.

Referring to FIG. 7, the memory system may include a memory device 710 and a memory controller 720.

The memory device 710 may transfer a data strobe signal DQS to the memory controller 720. The memory controller 720 may include the delay circuit 100 of FIG. 1. The delay circuit 100 of the memory controller 720 may be used to delay the data strobe signal DQS transferred from the memory device 710. The delay circuit may delay the data strobe signal DQS by 90 degrees based on a clock signal used in the memory controller 720.

Although various embodiments have been described for illustrative purposes, it will be apparent to those skilled in the art that various changes and modifications may be made without departing from the spirit and scope of the invention as defined in the following claims.

What is claimed is:

1. A delay circuit comprising:
    a variable delay line suitable for receiving an input signal and generating an output signal by delaying the input signal;
    a first phase difference detector suitable for detecting a phase difference between the input signal and a first clock;
    a second phase difference detector suitable for detecting a phase difference between the output signal and a second clock; and
    a control circuit suitable for adjusting a delay value of the variable delay line in response to a detection result of the first phase difference detector and a detection result of the second phase difference detector,
    wherein the first and second clocks have a phase difference corresponding to a target delay value of the variable delay line, and
    each of the first and second phase difference detectors comprises a time-to-digital converter.

2. The delay circuit of claim 1, wherein the control circuit increases the delay value of the variable delay line when the phase difference between the input signal and the first clock is greater than the phase difference between the output signal and the second clock, and decreases the delay value of the variable delay line when the phase difference between the output signal and the second clock is greater than the phase difference between the input signal and the first clock.

3. The delay circuit of claim 1, wherein the first phase difference detector comprises:
    first to Mth delay lines coupled in series and suitable for generating first to Mth clocks respectively by sequentially delaying the first clock, where M is an integer greater than or equal to 2; and
    first to Mth D flip-flops suitable for sampling the input signal in synchronization with the corresponding clocks among the first to Mth clocks,
    wherein the detection result of the first phase difference detector is outputted through output terminals of the first to Mth D flip-flops.

4. The delay circuit of claim 1, wherein the second phase difference detector comprises:
    first to Mth second delay lines coupled in series and suitable for generating first to Mth clocks respectively by sequentially delaying the second clock, where M is an integer greater than or equal to 2; and
    first to Mth D flip-flops suitable for sampling the output signal in synchronization with the corresponding clocks among the first to Mth clocks,
    wherein the detection result of the second phase difference detector is outputted through output terminals of the first to Mth D flip-flops.

5. The delay circuit of claim 1, wherein the input signal comprises a periodic wave.

6. A memory system comprising:
    a memory device; and
    a memory controller including a delay circuit,
    wherein the delay circuit includes:
    a variable delay line suitable for receiving a data strobe signal as an input signal from the memory device and generating an output signal by delaying the input signal;
    a first phase difference detector suitable for detecting a phase difference between the input signal and a first clock;
    a second phase difference detector suitable for detecting a phase difference between the output signal and a second clock; and
    a control circuit suitable for adjusting a delay value of the variable delay line in response to a detection result of the first phase difference detector and a detection result of the second phase difference detector,
    wherein the first and second clocks have a phase difference corresponding to a target delay value of the variable delay line, and
    each of the first and second phase difference detectors comprises a time-to-digital converter.

7. The memory system of claim 6, wherein the control circuit increases the delay value of the variable delay line when the phase difference between the input signal and the first clock is greater than the phase difference between the output signal and the second clock, and decreases the delay value of the variable delay line when the phase difference between the output signal and the second clock is greater than the phase difference between the input signal and the first clock.

8. The memory system of claim 6, wherein the first phase difference detector comprises:
    first to Mth delay lines coupled in series and suitable for generating first to Mth clocks respectively by sequentially delaying the first clock, where M is an integer greater than or equal to 2; and
    first to Mth D flip-flops suitable for sampling the input signal in synchronization with the corresponding clocks among the first to Mth clocks,
    wherein the detection result of the first phase difference detector is outputted through output terminals of the first to Mth D flip-flops.

9. The memory system of claim 6, wherein the second phase difference detector comprises:
    first to Mth second delay lines coupled in series and suitable for generating first to Mth clocks respectively by sequentially delaying the second clock, where M is an integer greater than or equal to 2; and
    first to Mth D flip-flops suitable for sampling the output signal in synchronization with the corresponding clocks among the first to Mth clocks,
    wherein the detection result of the second phase difference detector is outputted through output terminals of the first to Mth D flip-flops.

10. The memory system of claim 6, wherein the input signal comprises a periodic wave.

* * * * *